United States Patent
Hsu

(10) Patent No.: US 7,876,175 B2
(45) Date of Patent: Jan. 25, 2011

(54) COMPACT DIPLEXER

(75) Inventor: Min-Shun Hsu, Hsinchu (TW)

(73) Assignee: Ralink Technology Corp., Jhubei, Hsinchu County (TW)

( * ) Notice: Subject to any disclaimer, the term of this patent is extended or adjusted under 35 U.S.C. 154(b) by 227 days.

(21) Appl. No.: 12/264,221

(22) Filed: Nov. 3, 2008

(65) Prior Publication Data
US 2009/0243752 A1    Oct. 1, 2009

(30) Foreign Application Priority Data
Mar. 28, 2008    (TW) ............................. 97111534 A

(51) Int. Cl.
*H01P 5/12* (2006.01)
*H01P 1/213* (2006.01)

(52) U.S. Cl. ................. 333/126; 333/127; 333/129; 333/134; 455/78; 455/552.1

(58) Field of Classification Search ......... 333/126–129, 333/132, 134, 136; 455/78, 82, 552.1, 553.1
See application file for complete search history.

(56) References Cited

U.S. PATENT DOCUMENTS

| | | | |
|---|---|---|---|
| 5,652,599 A * | 7/1997 | Pitta et al. ................. | 343/858 |
| 6,307,525 B1 * | 10/2001 | Bateman et al. ............ | 343/853 |
| 6,389,269 B1 * | 5/2002 | Nanni et al. ................ | 455/93 |
| 6,608,534 B2 * | 8/2003 | Kushitani et al. ........... | 333/126 |
| 6,771,222 B1 * | 8/2004 | Rosenbaum ............ | 343/700 MS |
| 7,035,602 B2 * | 4/2006 | Satoh et al. ................ | 455/118 |
| 7,259,639 B2 * | 8/2007 | DeBhailis et al. ............ | 333/132 |
| 7,394,027 B2 * | 7/2008 | Kaluzni et al. .............. | 174/262 |
| 7,728,775 B2 * | 6/2010 | Shachar et al. .............. | 343/702 |

FOREIGN PATENT DOCUMENTS

JP    2006-211272    *    8/2006

* cited by examiner

*Primary Examiner*—Barbara Summons
(74) *Attorney, Agent, or Firm*—Winston Hsu; Scott Margo

(57) ABSTRACT

A diplexer for receiving and transmitting a first bandwidth signal corresponding to a first central frequency and a second bandwidth signal corresponding to a second central frequency includes a first signal end, a second signal end, a third signal end, a first impedance unit, a second impedance unit and a third impedance unit. The first impedance unit forms an impedance match with the third impedance unit when the third signal end receives or transmits the first bandwidth signal, and forms a high impedance unit when the third signal end receives or transmits the second bandwidth signal. The second impedance unit forms an impedance match with the third impedance unit when the third signal end receives or transmits the second bandwidth signal, and forms a high impedance unit when the third signal end receives or transmits the first bandwidth signal.

12 Claims, 6 Drawing Sheets

COMPACT DIPLEXER

BACKGROUND OF THE INVENTION

1. Field of the Invention

The present invention relates to a diplexer, and more particularly, to a compact lumped-distributed diplexer implemented on a printed circuit board for a wireless communication device.

2. Description of the Prior Art

In radio frequency front end circuit, a diplexer is an important high frequency component having three signal ends of two-to-one or one-to-two, for separating a mixed signal received from an antenna into different bandwidth signals, or sending a signal from a signal end to the signal end coupled to the antenna without leakage. Generally, the diplexer needs good isolation to avoid the interference when the two signal ends transmit different frequency signals.

A conventional diplexer is composed of a low-pass filter and a high-pass filter (or a band-pass filter) to separate different frequencies. Please refer to FIG. 1, which is a schematic diagram of a diplexer 10 according to the prior art. The diplexer 10 includes signal ends S1, S2 and S3, a low-pass filter LPF, and a high-pass filter HPF. The signal end S1 is coupled to an antenna 12, and used for receiving and transmitting a bandwidth signal LB and HB corresponding to a low frequency band and high frequency band respectively. Take the diplexer 10 operated in a receiving link as an example, after the signal end S1 receives the bandwidth signals LB and HB, the low-pass filter LPF filters out the bandwidth signal HB, and outputs the bandwidth signal LB to the signal end S2. The high-pass filter HPF filters out the bandwidth signal LB, and outputs the bandwidth signal HB to the signal end S3.

However, if the diplexer 10 is implemented on a printed circuit board, the circuit of the design occupies a serious area. Therefore, an application of a communication product now, such as a wireless access point device, a wireless router, or a wireless network card, the diplexer 10 is difficult to be integrated into a circuit system.

SUMMARY OF THE INVENTION

Therefore, the present invention provides a compact diplexer of a wireless communication device that is implemented on a printed circuit board, and has the advantages of low complexity, small circuit area, and low manufacture cost.

The present invention discloses a diplexer of a wireless communication device for receiving and transmitting a first bandwidth signal corresponding to a first central frequency and a second bandwidth signal corresponding to a second central frequency. The diplexer includes a first signal end, a second signal end, a third signal end, a first impedance unit, a second impedance unit, and a third impedance unit. The third signal end is used for receiving or transmitting the first bandwidth signal and the second bandwidth signal. The third impedance unit includes a first end coupled to the third signal end, and a second end. The first impedance unit is coupled to the first signal end and the second end of the third impedance unit and used for forming an impedance match with the third impedance unit when the third signal end receives or transmits the first bandwidth signal, and forming a high impedance unit when the third signal end receives or transmits the second bandwidth signal. The second impedance unit is coupled to the second signal end and the second end of the third impedance unit and used for forming an impedance match with the third impedance unit when the third signal end receives or transmits the second bandwidth signal, and forming a high impedance unit when the third signal end receives or transmits the first bandwidth signal.

Moreover, the present invention discloses a radio frequency (RF) transceiver of a wireless communication device for receiving and transmitting a first bandwidth signal corresponding to a first central frequency, and a second bandwidth signal corresponding to a second central frequency. The radio frequency transceiver includes an antenna, a first RF signal process unit, a second RF signal process unit, and a diplexer. The antenna is used for receiving and transmitting the first bandwidth signal and the second bandwidth signal. The first RF signal process unit is used for processing the first bandwidth signal, and the second RF signal process unit is used for processing the second bandwidth signal. The diplexer includes a first impedance unit, a second impedance unit, and a third impedance unit. The third impedance unit includes a first end coupled to the antenna and a second end. The first impedance unit is coupled to the first RF signal process unit and the second end of the third impedance unit and used for forming an impedance match with the third impedance unit when the third signal end receives or transmits the first bandwidth signal, and forming a high impedance unit when the third signal end receives or transmits the second bandwidth signal. The second impedance unit is coupled to the second RF signal process unit and the second end of the third impedance unit and used for forming an impedance match with the third impedance unit when the third signal end receives or transmits the second bandwidth signal, and forming a high impedance unit when the third signal end receives or transmits the first bandwidth signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
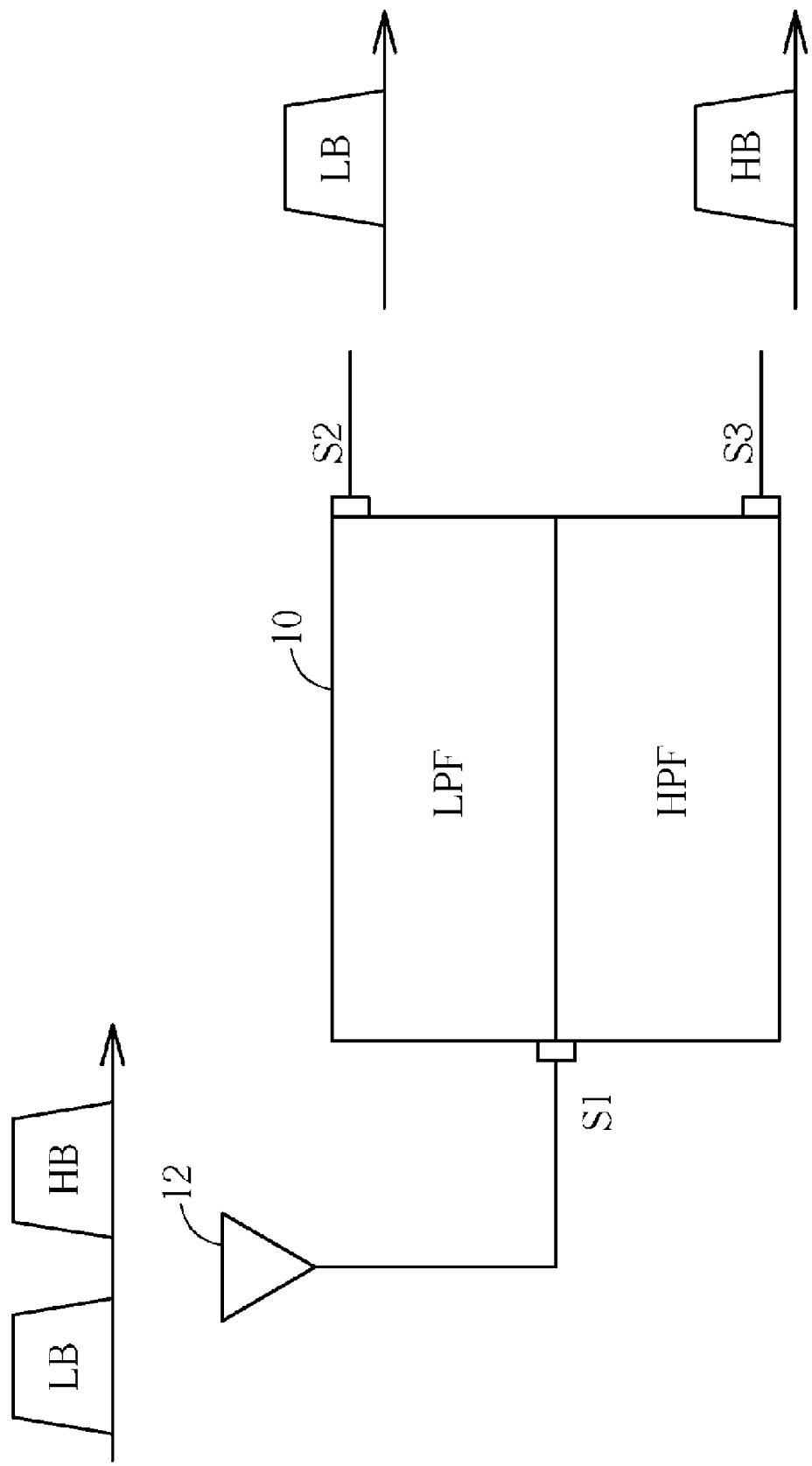
FIG. 1 is a schematic diagram of a diplexer according to the prior art.
Figure 2:
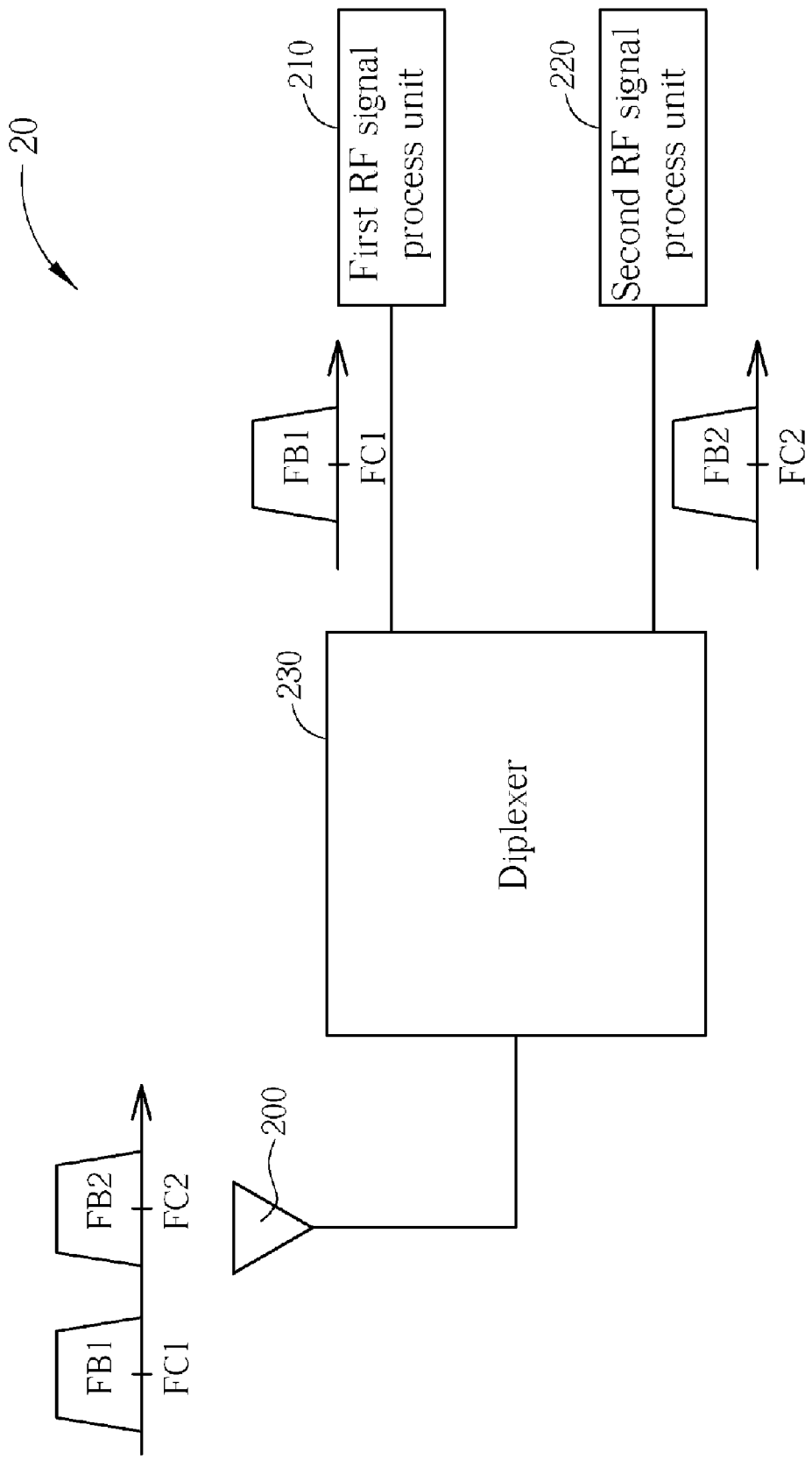
FIG. 2 is a block diagram of a radio frequency transceiver according to an embodiment of the present invention.

Please refer to FIG. 2, which is a block diagram of a radio frequency (RF) transceiver 20 according to an embodiment of the present invention. The radio frequency transceiver 20 is used for receiving and transmitting a first bandwidth signal FB1 corresponding to a first central frequency FC1, and a second bandwidth signal FB2 corresponding to a second central frequency FC2. The radio frequency transceiver 20 includes an antenna 200, a first RF signal process unit 210, a second RF signal process unit 220, and a diplexer 230. When the radio frequency transceiver 20 is operated in a receiving link, the antenna 200 receives the first bandwidth signal FB1, the second bandwidth signal FB2, or a mixed signal of the first bandwidth signal FB1 and the second bandwidth signal FB2. The diplexer 230 is used for separating signals received from the antenna 200 to send the first bandwidth signal FB1 to the first RF signal process unit 210, and the second bandwidth signal FB2 to the second RF signal process unit 220. Then, the first RF signal process unit 210 and the second RF signal process unit 220 processes the signals of the first bandwidth signal FB1 and the second bandwidth signal FB2 respectably, such as demodulation or decipher. In addition, when the radio frequency transceiver 20 is operated in a transmitting link and if the first RF signal process unit 210 outputs the first bandwidth signal FBI, the diplexer 230 sends the first bandwidth signal FB1 to the antenna 200, and keeps the first bandwidth signal FB1 outputted from the first RF signal process unit 210 from being transmitted to the second RF signal process unit 220. Finally, the antenna 200 transmits the first bandwidth signal FB1 in a form of radio waves. Similarly, the diplexer 230 sends the second bandwidth signal FB2 to the antenna 200, and keeps the second bandwidth signal FB2 from being transmitted to the first RF signal process unit 210.

Figure 3:
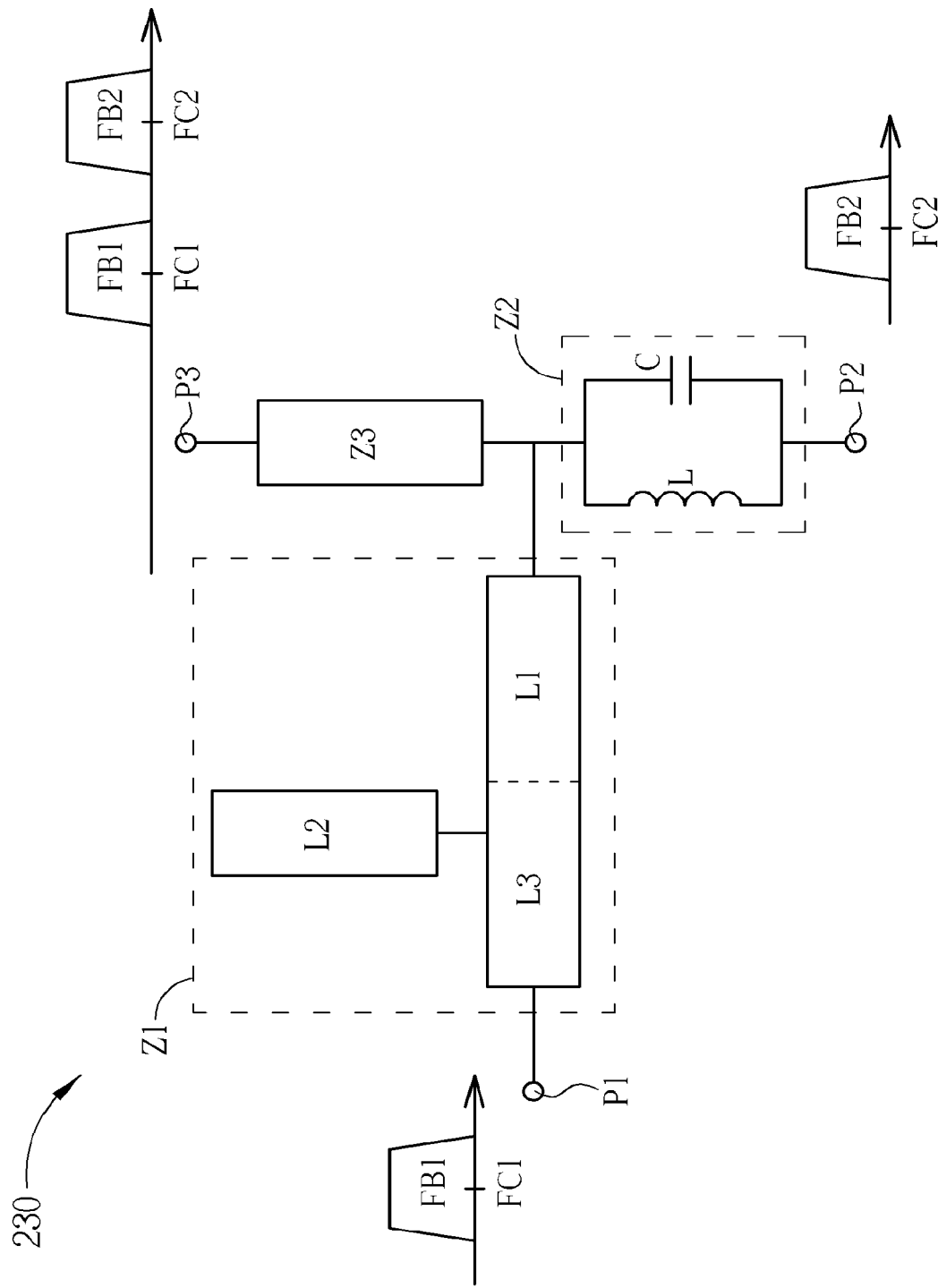
FIG. 3 is a structure diagram of a diplexer according to an exemplary embodiment of the present invention.

Please refer to FIG. 3, which is a diagram of the diplexer 230 according to a better embodiment of the FIG. 2. The diplexer 230 includes a first signal end P1, a second signal end P2, a third signal end P3, a first impedance unit Z1, a second impedance unit Z2, and a third impedance unit Z3. The first signal end P1 is coupled to the first RF signal process unit 210. The second signal end P2 is coupled to the second RF signal process unit 220. The third signal end P3 is coupled to the antenna 200 and used for receiving and transmitting the first bandwidth signal FB1 and the second bandwidth signal FB2. The third impedance unit Z3 preferably includes a micro strip for providing impedance. The first impedance unit Z1 includes a first signal transmission line L1, a second signal transmission line L2, and a sub impedance unit L3. The first signal transmission line LI and the second signal transmission line L2 are preferably micro strips with the same length that is preferably a quarter of a wavelength corresponding to the second central frequency FC2. One end of the second signal transmission line L2 is opened. In this situation, a combination of the first signal transmission line LI and the second signal transmission line L2 can be seen as half of a wavelength corresponding to the second central frequency FC2, equivalent to a parallel inductor-capacitor resonant circuit whose resonant frequency is the second central frequency FC2. The second impedance unit Z2 is a parallel inductor-capacitor resonant circuit whose resonant frequency is the first central frequency FC1.

Take the diplexer 230 operated in a receiving link as an example. When the first bandwidth signal FB1 is received by the antenna 200 and inputted to the third signal end P3, the third impedance unit Z3 forms an impedance match with the first impedance unit Z1, meanwhile the second impedance unit Z2 forms a high impedance for blocking the first bandwidth signal FB1. In this situation, after the first bandwidth signal FB1 passes through the third impedance unit Z3, the first bandwidth signal FB1 enters a signal path of the first impedance unit Z1, and outputs from the first signal end P1. Similarly, when the second bandwidth signal FB2 is inputted to the third signal end P3, the third impedance unit Z3 forms an impedance match with the second impedance unit Z2, and the first impedance unit Z1 forms a high impedance state to block the second bandwidth signal FB2. Therefore, after the second bandwidth signal FB2 passes through the third impedance unit Z3, the second bandwidth signal FB2 enters a signal path of the second impedance unit Z2, and outputs from the second signal end P2.

Take the diplexer 230 operated in a transmitting link as an example. When the first bandwidth signal FB1 inputs to the first signal end P1 and passes through the first impedance unit Z1, the first bandwidth signal FB1 enters the third impedance unit Z3 and outputs to the antenna 200 through the third signal end P3 since the second impedance unit Z2 is a high impedance path for the first bandwidth signal FB1. Similarly, when the second bandwidth signal FB2 enters the second signal end P2 and passes through the second impedance unit Z2, the second bandwidth signal FB2 enters the third impedance unit Z3 and outputs through the third signal end P3 since the first impedance unit Z1 is a high impedance path for the second bandwidth signal FB2.

Briefly, the first impedance unit Z1 and the third impedance unit Z3 form an unobstructed signal path for the first bandwidth signal FB1. On the other hand, the second impedance unit Z2 and the third impedance unit Z3 form an unobstructed signal path for the second bandwidth signal FB2. Therefore, the diplexer has a capability of frequency separation.

Preferably, the diplexer 230 and the radio frequency transceiver 20 is applied to a wireless access point device, a wireless router, a wireless network card, or similar to a wireless communication device and receive and transmit signals conforming to the wireless LAN (Local Area Network) standard IEEE 802.11 a/b/g/n set forth by the IEEE (the Institute of Electrical and Electronics Engineers). In this situation, the first central frequency FC1 is set to 2.4 gigahertz (GHz), and the second central frequency FC2 is set to 5 GHz.

Figure 4:
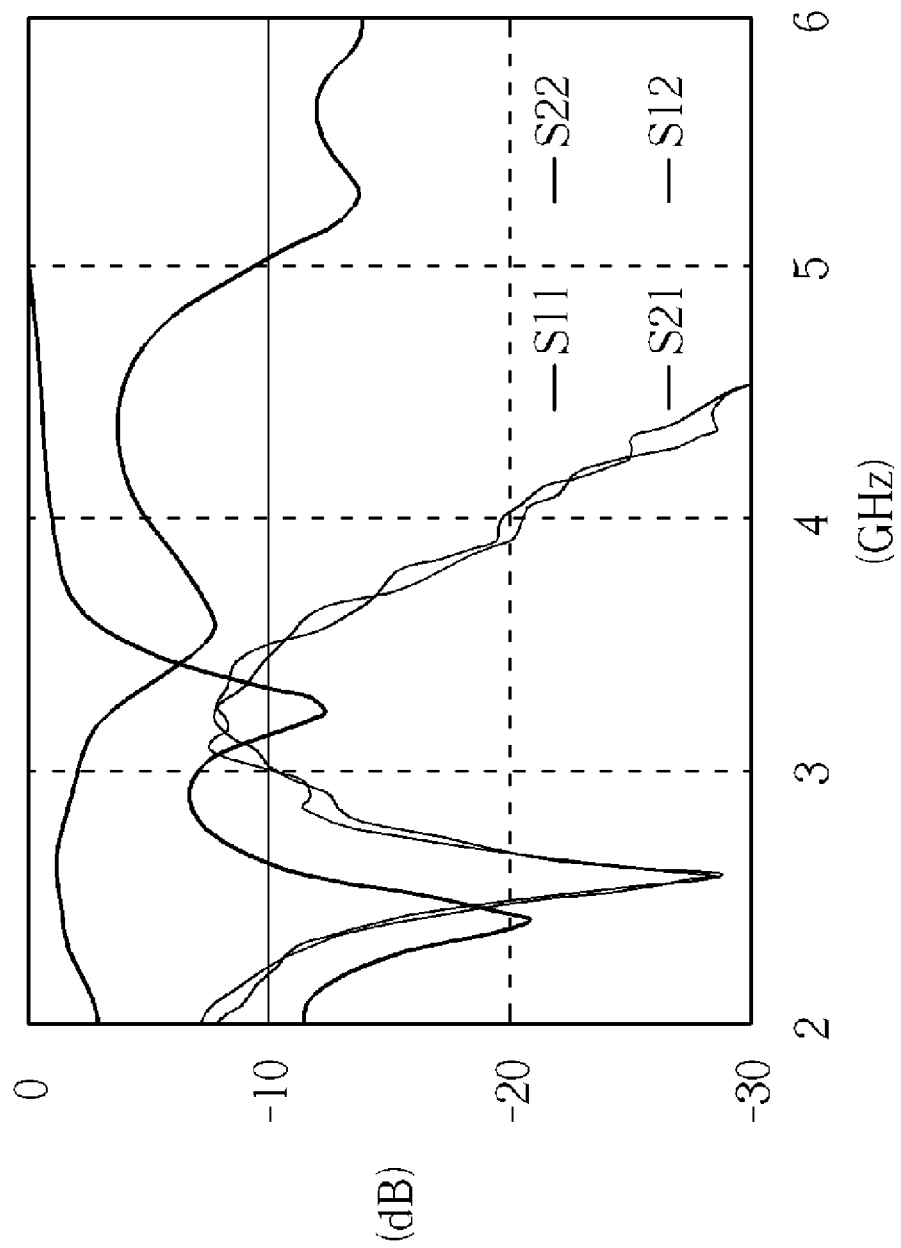
FIG. 4, FIG. 5, and FIG. 6 are frequency response diagrams of the diplexer according to the FIG. 3.
Figure 5:
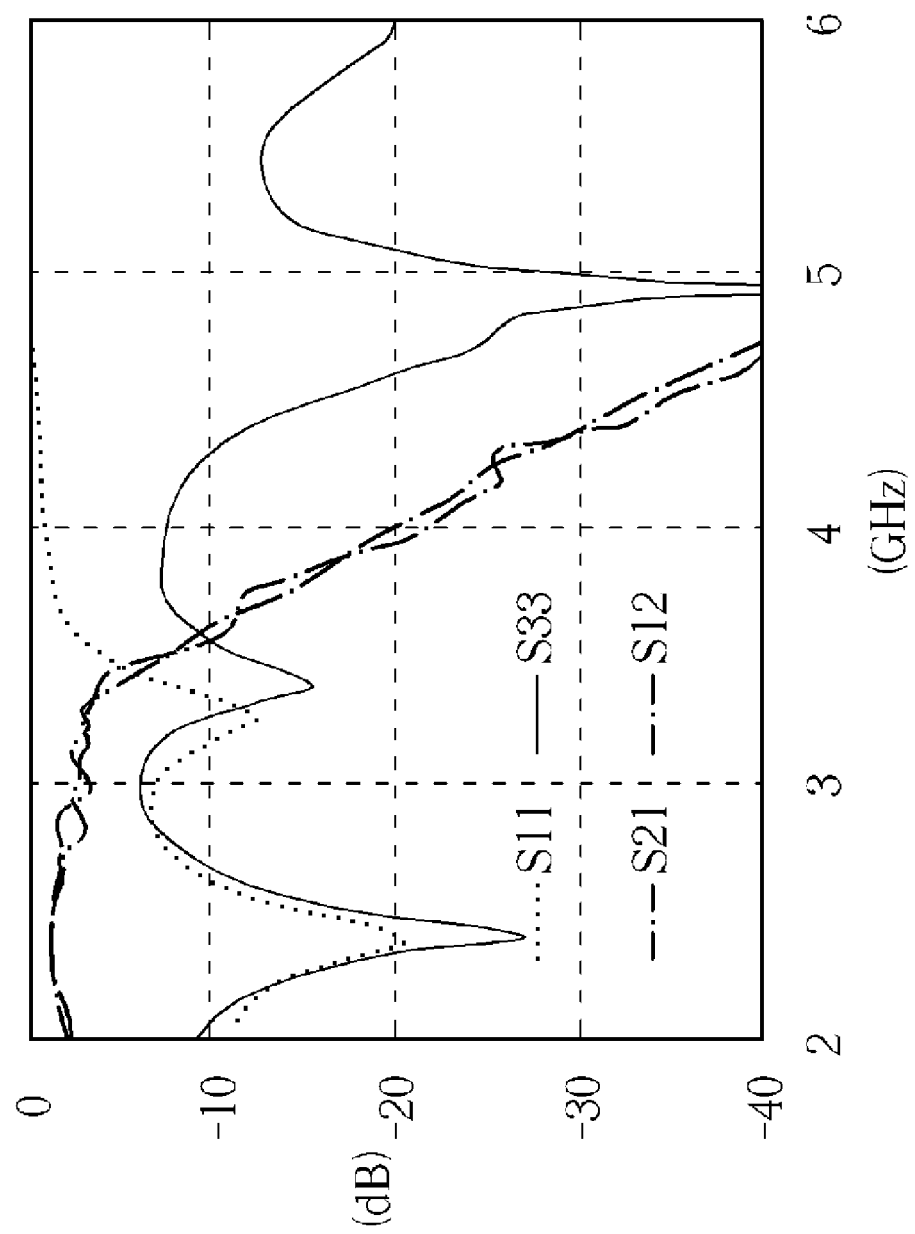
Figure 6:
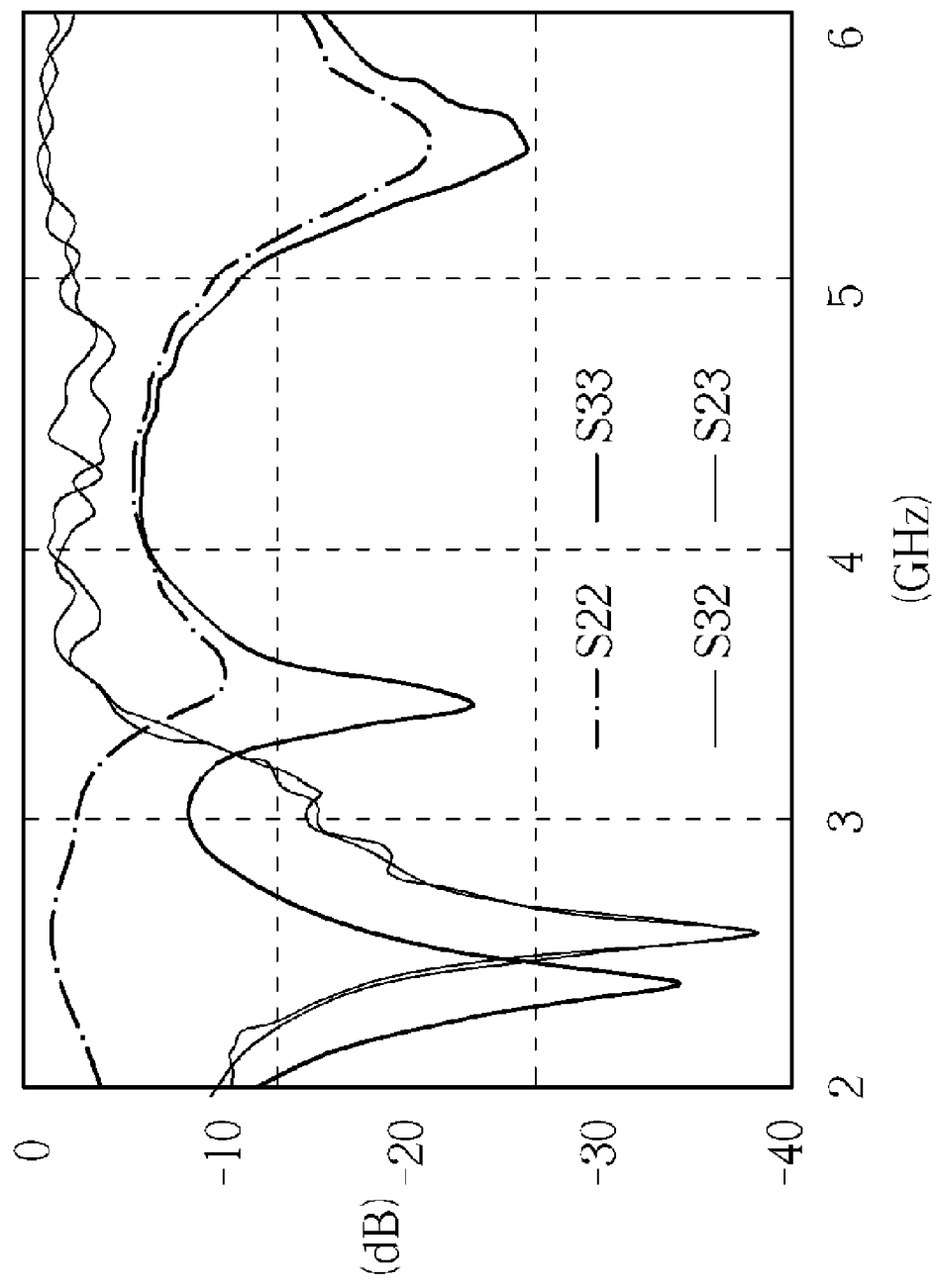

Please refer to FIGS. 4-6, which are frequency response diagrams of the diplexer 230. The diplexer 230 is implemented on a dielectric substrate made of FR4 fiberglass, and corresponding parameters are a relative dielectric coefficient $\in r=4.3$, a thickness h=0.215 mm, a loss tangent value tan $\delta=0.023$ and a practical area is around $10*10$ mm$^2$. In FIG. 4, the third signal end P3 of the diplexer 230 is coupled to a 50-ohm resistor. Practical measurement results of scattering parameters S11, S12, S21, and S22 of the diplexer 230 are shown in FIG. 4, where the row and column axes indicate frequency in GHz and power in dB respectively. The scattering parameters S12 and S23 are both lower than −15 dB at the central frequencies of 2.4 and 5 GHz. Therefore, the paths corresponding to the first signal end P1 and the second signal end P2 have good isolation. In FIGS. 5-6, the second signal end P2 and the first signal end P1 of the diplexer 230 are coupled to a 50-ohm resistor respectively. As can be seen from the scattering parameters S13, S31, S23, and S32, paths of the first signal end P1 and the third signal end P3 form an impedance match when operating at the 2.4 GHz frequency band, and paths of the second signal end P2 and the third signal end P3 also form an impedance match when operating at the 5 GHz frequency band. The diplexer 230 can restrain a second order harmonic wave corresponding to the central frequency 2.4 GHz by over 40 dB. Besides, as can be seen from the scattering parameters S11, S22, S33, reflection losses of the diplexer 230 at the 2.4 GHz and 5 GHz bandwidths are both lower than −10 dB, and insertion losses are both lower than −1.5 dB. Therefore, the diplexer 230 of the present invention embodiment has remarkable performance on the impedance characteristics, and conforms to requirements of the wireless LAN standard IEEE 802.11 a/b/g/n.

In conclusion, the embodiment of the present invention provides a compact lump distributed diplexer, which can form an impedance match or a high impedance characteristic between signal path and signal path under different frequencies. Therefore, the diplexer has advantages of low reflection, high isolation, small circuit area, and simple architecture, and can be combined with the printed circuit board.

Those skilled in the art will readily observe that numerous modifications and alterations of the device and method may be made while retaining the teachings of the invention.

What is claimed is:

1. A diplexer for receiving and transmitting a first bandwidth signal corresponding to a first central frequency and a second bandwidth signal corresponding to a second central frequency, the diplexer comprising:
- a first signal end;
- a second signal end;
- a third signal end for receiving or transmitting the first bandwidth signal and the second bandwidth signal;
- a first impedance unit comprising a first end coupled to the first signal end, and a second end, the first impedance unit forming an impedance match with a third impedance unit coupled to the third signal end when the third signal end receives or transmits the first bandwidth signal, and forming a high impedance unit when the third signal end receives or transmits the second bandwidth signal;
- a second impedance unit comprising a first end coupled to the second signal end, and a second end, the second impedance unit forming an impedance match with the third impedance unit when the third signal end receives or transmits the second bandwidth signal, and forming a high impedance unit when the third signal end receives or transmits the first bandwidth signal; and
- the third impedance unit comprising a first end coupled to the third signal end, and a second end coupled to the second end of the first impedance unit and the second end of the second impedance unit;
- wherein the first impedance unit comprises:
  - a first signal transmission line comprising a first end coupled to the second end of the third impedance unit, and a second end;
  - a second signal transmission line comprising a first end opened, and a second end; and
  - a sub impedance unit comprising a first end coupled to the first signal end, and a second end coupled to the second end of the first signal transmission line and the second end of the second signal transmission line;
  - wherein a length of the first signal transmission line and a length of the second signal transmission line correspond to a quarter of a wavelength corresponding to the second central frequency.

2. The diplexer of claim 1, wherein the second impedance unit is a parallel inductor-capacitor resonant circuit whose resonant frequency corresponds to the first central frequency.

3. The diplexer of claim 1, wherein the first central frequency is 2.4 gigahertz.

4. The diplexer of claim 1, wherein the second central frequency is 5 gigahertz.

5. The diplexer of claim 1 being made on a dielectric substrate made of FR4 fiberglass.

6. A wireless communicator comprising the diplexer of claim 1, wherein the wireless communicator is a wireless access point device, a wireless router, or a wireless network card.

7. A radio frequency (RF) transceiver of a wireless communication device, for receiving and transmitting a first bandwidth signal corresponding to a first central frequency, and a second bandwidth signal corresponding to a second central frequency, the RF transceiver comprising:
- an antenna for receiving and transmitting the first bandwidth signal and the second bandwidth signal;
- a first RF signal process unit, for processing the first bandwidth signal;
- a second RF signal process unit, for processing the second bandwidth signal;
- a diplexer coupled to the antenna, the diplexer comprising:
  - a first signal end;
  - a second signal end;
  - a third signal end for receiving or transmitting the first bandwidth signal and the second bandwidth signal;
  - a first impedance unit comprising a first end coupled to the first signal end, and a second end, the first impedance unit forming an impedance match with a third impedance unit coupled to the third signal end when the third signal end receives or transmits the first bandwidth signal, and forming a high impedance unit when the third signal end receives or transmits the second bandwidth signal;
  - a second impedance unit comprising a first end coupled to the second signal end, and a second end, the second impedance unit forming an impedance match with the third impedance unit when the third signal end receives or transmits the second bandwidth signal, and forming a high impedance unit when the third signal end receives or transmits the first bandwidth signal; and
  - the third impedance unit comprising a first end coupled to the antenna and a second end coupled to the second end of the first impedance unit and the second end of the second impedance unit;
  - wherein the first impedance unit comprises:
    - a first signal transmission line comprising a first end coupled to the second end of the third impedance unit, and a second end;
    - a second signal transmission line comprising a first end opened, and a second end; and
    - a sub impedance unit comprising a first end coupled to the first signal end, and a second end coupled to the second end of the first signal transmission line and the second end of the second signal transmission line;
    - wherein a length of the first signal transmission line and a length of the second signal transmission line correspond to a quarter of a wavelength corresponding to the second central frequency.

8. The RF transceiver of claim 7, wherein the second impedance unit is a parallel inductor-capacitor resonant circuit whose resonant frequency corresponds to the first central frequency.

9. The RF transceiver of claim 7, wherein the first central frequency is 2.4 gigahertz.

10. The RF transceiver of claim 7, wherein the second central frequency is 5 gigahertz.

11. The RF transceiver of claim 7, wherein the diplexer is made on a dielectric substrate made of FR4 fiberglass.

12. The RF transceiver of claim 7, wherein the wireless communicator is a wireless access point device, a wireless router, or a wireless network card.

* * * * *